(12) United States Patent
Klinck

(10) Patent No.: US 7,024,330 B2
(45) Date of Patent: Apr. 4, 2006

(54) METHOD AND APPARATUS FOR DECREASING AUTOMATIC TEST EQUIPMENT SETUP TIME

(75) Inventor: Jay Klinck, Durham, NC (US)

(73) Assignee: Mitsubishi Electric and Electronics U.S.A., Inc., Cypress, CA (US)

( * ) Notice: Subject to any disclaimer, the term of this patent is extended or adjusted under 35 U.S.C. 154(b) by 0 days.

(21) Appl. No.: 10/402,530

(22) Filed: Mar. 28, 2003

(65) Prior Publication Data

US 2004/0204887 A1    Oct. 14, 2004

(51) Int. Cl.
*G06F 19/00*    (2006.01)
(52) U.S. Cl. .................... 702/123; 711/170
(58) Field of Classification Search ............ 702/80, 702/90, 108, 117–119, 121–124, 127, 182, 702/183, 189, 193, 120; 714/724, 725; 717/171, 717/120; 711/170; 455/456.1
See application file for complete search history.

(56) References Cited

U.S. PATENT DOCUMENTS

| | | | |
|---|---|---|---|
| 4,348,759 A * | 9/1982 | Schnurmann | 714/724 |
| 5,477,139 A | 12/1995 | West et al. | |
| 5,629,878 A | 5/1997 | Kobrosly | |
| 5,913,022 A | 6/1999 | Tinaztepe et al. | |
| 6,003,149 A | 12/1999 | Nevill et al. | |
| 6,006,346 A * | 12/1999 | Fournel et al. | 714/724 |
| 6,067,651 A | 5/2000 | Rohrbaugh et al. | |
| 6,308,292 B1 | 10/2001 | Fusco | |
| 6,442,499 B1 * | 8/2002 | Gorin | 702/120 |
| 6,622,272 B1 * | 9/2003 | Haverkamp et al. | 714/725 |
| 6,735,757 B1 * | 5/2004 | Kroening et al. | 717/120 |
| 2002/0016897 A1 * | 2/2002 | Nerl | 711/170 |
| 2004/0060044 A1 * | 3/2004 | Das et al. | 717/171 |
| 2004/0198374 A1 * | 10/2004 | Bajikar | 455/456.1 |

* cited by examiner

*Primary Examiner*—Marc S. Hoff
*Assistant Examiner*—Mohamed Charioui
(74) *Attorney, Agent, or Firm*—Buchanan Ingersoll PC

(57) ABSTRACT

In automatic test equipment (ATE), the current state of all configurable hardware components is maintained in one or more status registers. A configuration interface operates between the ATE test program and the hardware components. The test program issues instructions for configuring the hardware components to the configuration interface, which considers the current configuration status of each hardware component stored in the status registers. When a hardware component is instructed to assume a specific configuration for a given task, the configuration interface compares the target configuration with the current configuration status and forwards the instruction only if they are different, i.e., if the current hardware configuration must be updated. The associated wait times for instructions issued where the target configuration matches the current configuration status are avoided, decreasing setup time.

32 Claims, 3 Drawing Sheets

|      | INSTRUCTIONS |         |         |         |         |         |
| ---- | ------- | ------- | ------- | ------- | ------- | ------- |
| TASK | COMP[0] | COMP[1] | COMP[2] | COMP[3] | COMP[4] | COMP[5] |
| 1    | X       | X       | O       | O       | X       | O       |
| 2    | O       | X       | X       | O       | O       | X       |
| 3    | O       | X       | X       | X       | X       | X       |
| 4    | O       | O       | X       | X       | O       | O       |
| 5    | O       | O       | X       | X       | O       | O       |

Fig. 3

METHOD AND APPARATUS FOR DECREASING AUTOMATIC TEST EQUIPMENT SETUP TIME

BACKGROUND

The present invention is related to automatic test equipment, and more particularly to a method and apparatus for reducing automated test equipment setup time.

Automatic test equipment (ATE) for testing electronic circuits and other devices normally operate under control of a test program running in the ATE. The ATE includes an associated computer or microprocessor for executing the program. The program typically includes instructions to control the ATE to perform multiple testing tasks in a sequence. The program is preferably modular, including one or more routines, or subroutines, for each associated task.

The ATE also includes many hardware components that require configuration, or reconfiguration, for each task. That is, the physical interconnections of the hardware components of the ATE are modified from one task to the next. For example, a relay may be closed during one task and opened for the next. Similarly, a power supply may be required to be inactive or active in one of one or more configurations for each associated task. Many other hardware component modifications may be required during the course of a test. Consequently, the program must configure the ATE hardware components before beginning each task. That is, each subroutine must include sequential instructions to reconfigure each hardware component for the given task. This results in additional "setup time" for each task.

Delays in setup time are typically compounded since subsequent tasks are required to wait for the completion of a previous task before performing the next task. For example, when the program must wait for a relay to settle before activating a power supply, and then for the power supply to reach full power before configuring the next component, the wait times are additive, which results in an increase in the setup time. These wait times are conventionally implemented by timers that are activated with each command, the subsequent configuration change being delayed until the timer has expired.

This setup time should preferably be minimized, since it adds to the overall time to perform each task, which adds significantly to the overall time to perform a test comprised of multiple tasks. Decreasing the time required to test devices results in decreasing production costs. The setup time for each given task impacts testing time significantly, since it is typically much longer than the time required to perform the given task. For example, relay settling times during setup typically take milliseconds, while the subsequent task may be performed in microseconds.

One way to minimize the setup time for each task is to avoid unnecessary instructions and their associated wait times. For example, when one or more components are already in the proper configuration from the previous task, the issuance of instructions during setup to configure/reconfigure those components is unnecessary, and may be avoided. This would eliminate the unnecessary instructions and the associated wait time for each hardware component to fully configure. However, each subroutine does not know the resulting configuration of each hardware component after the previous task, which may include the proper configuration of some or all of the associated hardware components. A possible solution is to create multiple versions of a subroutine to perform single task, each custom tailored to issue only the needed instructions based on the knowledge of which previous subroutine was executed. However, this approach is not followed since it leads to long and complex programming requirements, which reduces many of the advantages of modular programming, such as portability. As a result, in a conventional ATE, each subroutine will blindly issue setup instructions to all associated hardware components for a given task without consideration of the current configuration, adding considerably to the setup time.

Accordingly, there is a need to efficiently minimize the setup time for each task by avoiding the wait times associated with the configuration of hardware components that are already properly configured from a previous task.

SUMMARY

The present invention addresses these and other concerns. The current state ("configuration status") of all configurable hardware components is preferably stored in one or more status registers maintained in a storage means. A configuration interface operates between the ATE test program and the hardware components. The ATE test program issues the instructions for configuring the hardware components to the configuration interface, which considers the current configuration status of each hardware component stored in the status registers. When a hardware component is instructed to assume a specific configuration for a given task ("target configuration") by the associated subroutine of the ATE test program, the configuration interface compares the target configuration with the current configuration status and forwards the instruction only if they are different, i.e., if the current hardware configuration must be updated. The associated wait times for instructions issued where the target configuration matches the current configuration status are avoided, decreasing setup time.

The status of the hardware components is maintained in the associated register(s) by updating associated bits in the register(s) when an instruction is issued by the program that changes a respective hardware component's configuration, as determined by the configuration interface.

The configuration interface may be realized as a processor executing instructions from an additional layer of programming or as a subroutine in the ATE test program. A separate processor may be employed or processing resources may be shared with the ATE test program. The ATE test program subroutines may be executed without the knowledge of the current configuration status, which allows the use of existing test program modules with little or no modification.

According to one aspect, a method of configuring automatic test equipment to perform a testing task includes analyzing a test program configuration instruction to determine an identity of an associated component and a target configuration for the associated component, comparing the target configuration with a configuration status of the associated component, and updating a component configuration of the component to the target configuration only when the configuration status indicates the component configuration is different from the target configuration According to another aspect, an ATE apparatus for performing testing tasks comprises a processor for executing a configuration instruction according to a test program, at least one configurable component that is configurable according to the configuration instruction, and a configuration interface for analyzing the configuration instruction to determine an identity of an associated component and a target configuration for the associated component, for comparing the target configuration with a configuration status of the associated component, and for updating a component configuration of the component to the target configuration only when the configuration status indicates the component configuration is different from the target configuration.

According to yet another aspect, an apparatus for interfacing a test program for an ATE apparatus to at least one configurable component comprises a configuration interface for analyzing a configuration instruction executed according to the test program to request that an associated component be configured to determine an identity of the associated component and a target configuration for the associated component, for comparing the target configuration with a configuration status of the associated component, and for updating a component configuration of the component to the target configuration only when the configuration status indicates the component configuration is different from the target configuration.

According to still another aspect, an ATE apparatus for performing testing tasks comprises logic that analyzes a test program configuration instruction to determine an identity of an associated component and a target configuration for the associated component, logic that compares the target configuration with a configuration status of the associated component, and logic that updates a component configuration of the component to the target configuration only when the configuration status indicates the component configuration is different from the target configuration.

BRIEF DESCRIPTION OF THE DRAWINGS

The above and other objects, features, and advantages of the present invention will become more apparent in light of the following detailed description in conjunction with the drawings, in which:

FIG. 3 is a table illustrating the time saving advantages of the present invention.

DETAILED DESCRIPTION

Preferred embodiments of the present invention are described below with reference to the accompanying drawings. In the following description, well-known functions and/or constructions are not described in detail to avoid obscuring the invention in unnecessary detail.

Figure 1:
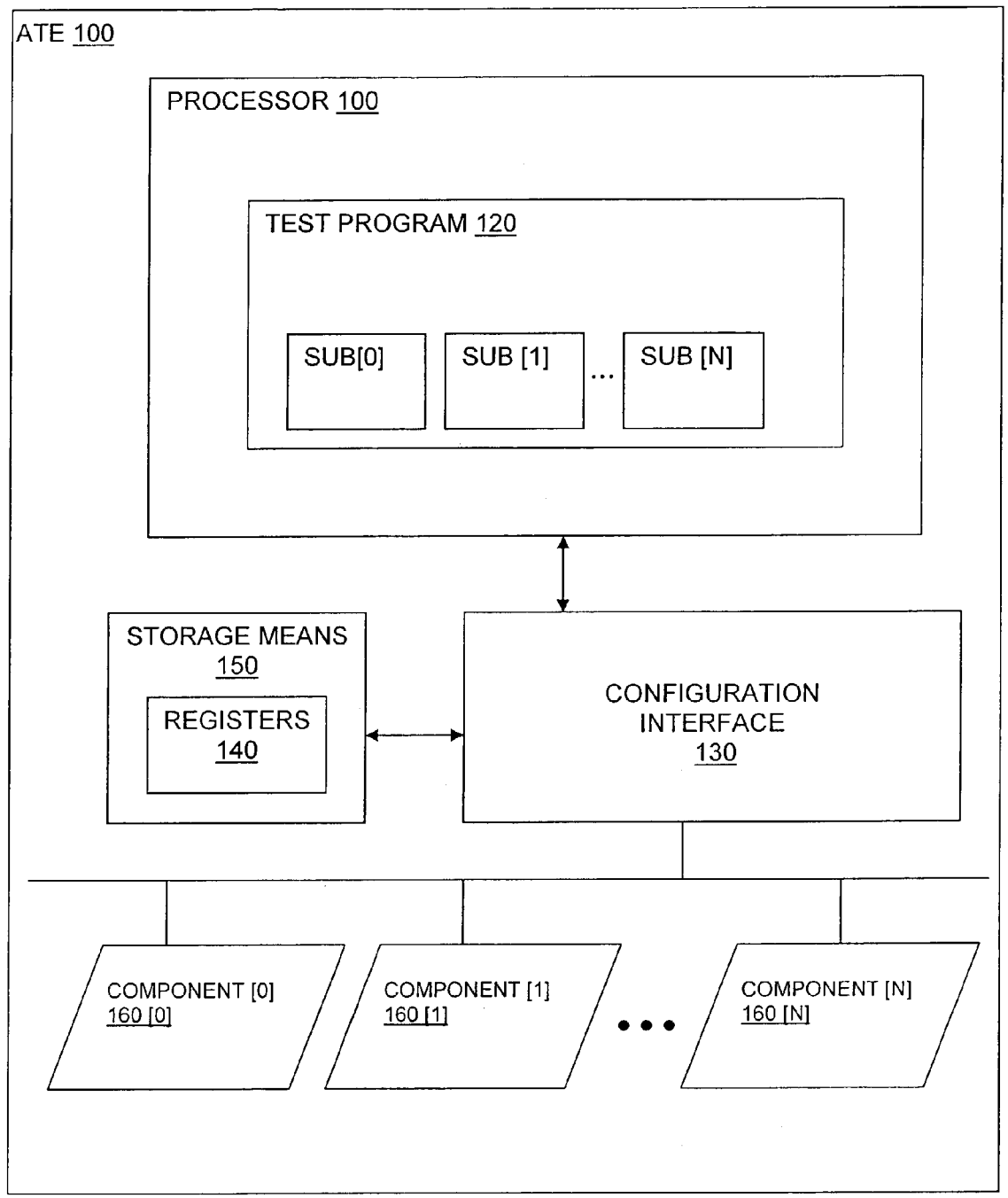
FIG. 1 is a block diagram illustrating an exemplary ATE according to the present invention.

Turning to the drawings, FIG. 1 is a block diagram illustrating an exemplary ATE 100 according to the present invention. The ATE 100 comprises one or more processors 110 for executing a test program 120. The test program 120 is typically modular, comprising multiple subroutines, SUB[0]–SUB[N], that are called into operation as needed. One or more subroutines are associated with a given testing task. For example, SUB[0] may contain all the instructions necessary to perform a given task, such as testing one aspect of an IC chip or other device under test (not shown).

The ATE also comprises multiple components 160[0]–160[N] that are configurable for each given task. For example, with reference to the table of FIG. 3, task 1 requires components COMP[0]–COMP[5] to each take on a certain configuration depicted by the X's and 0's in the row for task 1. A subroutine associated with task 1 must first issue instructions ("configuration instructions") that properly configure COMP[0]–COMP[5] for task 1. Some examples of components are relays, power supplies, signal generators, measuring units, etc. In each case, all associated components should be in one of two or more states for a given task.

A configuration interface 130 is interposed between the processor and the components 160[0]–160[N] to receive the configuration instructions and selectively issue commands to configure the components 160[0]–160[N] as required. That is, the configuration interface will only issue commands to configure the components 160[0]–160[N] that are improperly configured as a result of a previous instruction from a previous subroutine, which will usually be a subset of all the components associated with the task. The configuration interface 130 may be realized as a processor executing instructions from an additional layer of programming or as a subroutine in the ATE test program 120. A separate processor may be employed or processing resources may be shared with the ATE test program 120.

A storage means 150 stores one or more registers 140 that contain information corresponding to the current configuration status of each configurable component of the ATE. For example, a 32-bit register may designate one bit to each of 32 configurable relays in the ATE, with a "0" representing open contacts and a "1" representing closed contacts. Where more than two configurations are possible for a component, the requisite number of bits may be assigned. For example, if a power supply may be configured to operate in one of eight different modes, three bits would be assigned, having eight possible binary combinations. The storage means 150 is preferably a memory of the ATE that is easily accessed and updated, such as RAM. The storage means 150 may be a portion of a pool of memory resources used for other purposes, such as test data storage.

The register(s) 140 are read by the configuration interface 130 to determine the current configuration status of a given component 160[0]–160[N]. The register(s) 140 are also updated by the configuration interface 130 when the configuration of a given component 160[0]–160[N] is changed according to a command issued by the configuration interface 130. As a result, the register(s) 140 always contain the most current configuration of each component 160[0]–160[N].

Figure 2:
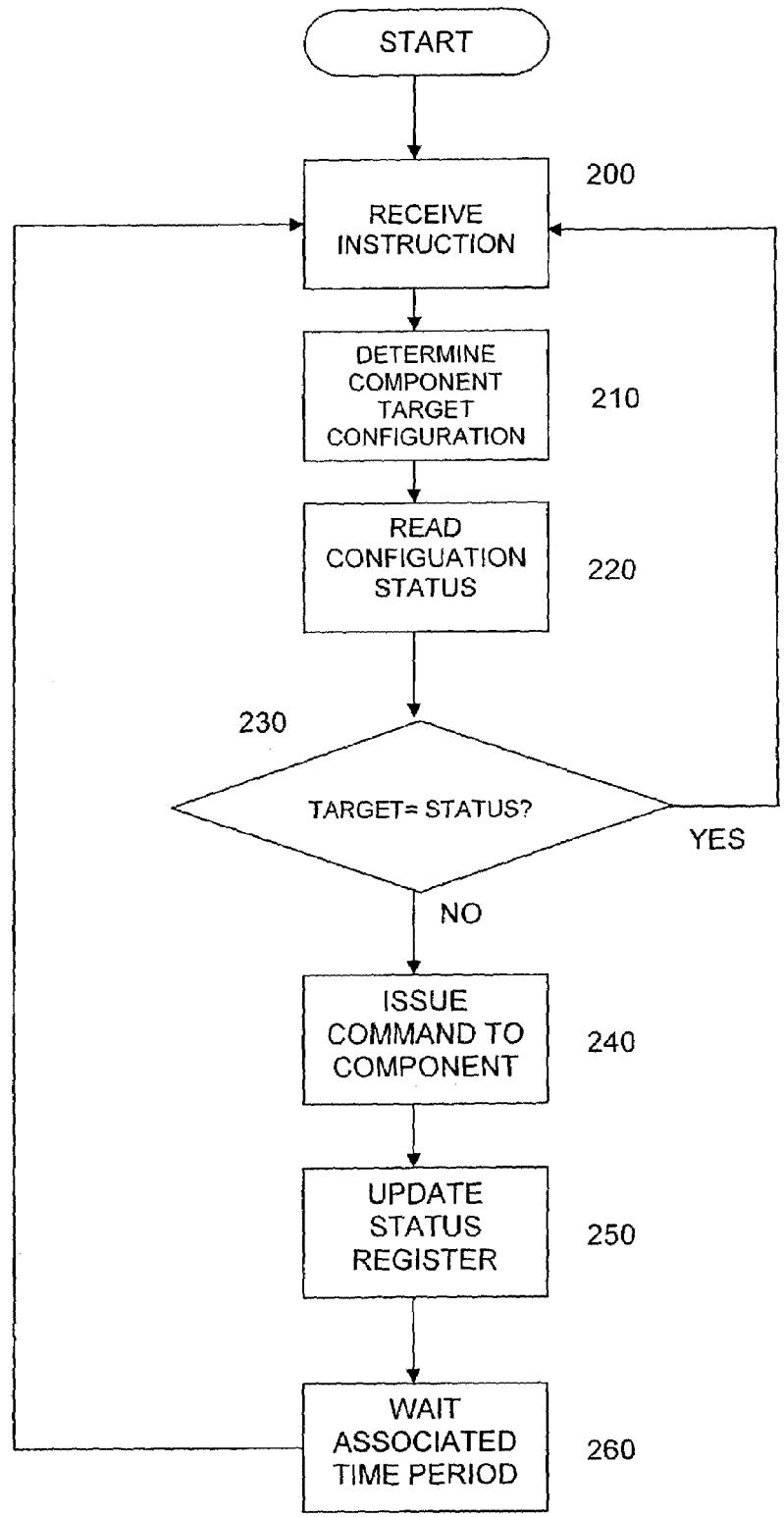
FIG. 2 is a flow chart illustrating the operation of the exemplary ATE according to the present invention.

FIG. 2 is a flow chart illustrating the operation of the exemplary ATE according to the present invention. When a task is initiated, the associated subroutine(s) SUB[0]–SUB[N] for the task will issue configuration instructions to configure the associated component(s) 160[0]–160[N]. The subroutines may be executed without the knowledge of the current configuration status, which allows the use of existing test program modules with little or no modification. Each configuration instruction is received at the configuration interface 130 (step 200). The configuration interface 130 analyzes configuration instruction to determine which associated component 160[0]–160[N] is being instructed and the target configuration for the associated component 160[0]–160[N] (step 210). The current configuration status for the associated component 160[0]–160[N] is read from the status register(s) 140 (step 220).

A comparison is then made between the target configuration and configuration status to determine if the associated component's 160[0]–160[N] current configuration requires modification (step 230). If the configuration status matches the target configuration, then the associated component's 160[0]–160[N] current configuration is correct and no modification is required. The procedure may then be repeated for the next instruction.

If, however, the target status differs from the current configuration status, a command is issued to modify the configuration of the associated component 160[0]–160[N] (step 240). The associated bit(s) in the register(s) 140 is then updated with a new configuration status corresponding to the new configuration of the associated component 160[0]–160[N] (step 250). Meanwhile, a corresponding wait period is observed to allow the associated component 160[0]–160[N] to safely complete the configuration change (step 260). For example, the wait period may be observed to allow for relay settling time, power supply activation/deactivation time, etc. The procedure may then be repeated for the next instruction.

Referring again to FIG. 3, a table illustrating the time saving advantages of the present invention is shown. By way of example, an ATE may perform five sequential tasks, tasks 1–5, during the course of a test. Each task will have an associated set of components COMP[0]–COMP[5] that must be configured for the task. For simplicity, we will assume that all of tasks 1–5 are associated with all of components COMP[0]–COMP[5] and that each component has two possible configurations "X" and "0".

As can be appreciated from the table of FIG. 3, each task will require a set of configurations for the associated components COMP[0]–COMP[5], which may differ partially or in whole from each of the other tasks' set of configurations. For example, as indicated by the associated rows, the configuration set for tasks 1 and 2 require the same configuration for COMP[1] and COMP[3]. It follows that only the remaining four components need to change configurations when sequencing from task 1 to task 2. Similarly, when sequencing from task 2 to task 3, only two components need to change configurations, namely COMP[3] and COMP[4]. When sequencing from task 4 to task 5, no configuration changes need to take place. However, in a conventional ATE, the program will blindly issue configuration instructions requiring that all six components be configured, and the associated wait periods expended, before beginning each sequential task. If we assume that each component requires an associated wait period of 100 ms to complete a configuration change, a setup time of 600 ms for each and every task will result. This translates to 3s of testing time being expended on setup time to complete tasks 1–5.

According to the present invention, component configurations are only changed, and the associated wait periods expended, when the new configuration differs from the current configuration, i.e., the configuration resulting from the previous task. Referring to the table of FIG. 3, a configuration change is only required where consecutive configurations (X's and 0's) in the same column, i.e., the same component, are different. For example, COMP[0] requires only one configuration change from task 1 to task 2 and then remains in that configuration for tasks 2–5. Similarly, COMP[1]–COMP[3] require only one configuration change, COMP[4] requires three, and COMP[5] requires two configuration changes. Therefore, a total of nine configuration changes are required for the same sequence of tasks according to the present invention, which translates to 900 ms of testing time being expended on setup time to complete tasks 1–5. Consequently, according to the present invention, 2.1 s of testing time is saved.

The time expended for execution of the added instructions executed by the configuration interface is significantly less, typically microseconds, compared to the savings in setup time. Consequently, according to the present invention, overall testing time is significantly reduced, which results in decreased production costs.

It will be appreciated that the steps of the methods illustrated above may be readily implemented either by software that is executed by a suitable processor or by hardware, such as an application-specific integrated circuit (ASIC).

Although described with reference to automatic test equipment, it will be appreciated by those of ordinary skill in the art that this invention can be embodied in other specific forms without departing from its essential character. For example, the invention may be used in any system controlling a number of components. The embodiments described above should therefore be considered in all respects to be illustrative and not restrictive.

The various aspects of the invention have been described in connection with exemplary embodiments. To facilitate an understanding of the invention, many aspects of the invention were described in terms of sequences of actions that may be performed by elements of a computer system. For example, it will be recognized that in each of the embodiments, the various actions could be performed by specialized circuits (e.g., discrete logic gates interconnected to perform a specialized function), by program instructions being executed by one or more processors, or by a combination of both.

Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

Various embodiments of Applicants' invention have been described, but it will be appreciated by those of ordinary skill in this art that these embodiments are merely illustrative and that many other embodiments are possible. The intended scope of the invention is set forth by the following claims, rather than the preceding description, and all variations that fall within the scope of the claims are intended to be embraced therein.

What is claimed is:

1. A method of configuring components in an apparatus to perform a task, comprising the steps of:
analyzing a program configuration instruction to determine an identity of an associated component and a target configuration for the associated component;
comparing the target configuration with a configuration status of the associated component; and
updating a component configuration of the component to the target configuration only when the configuration status indicates the component configuration is different from the target configuration.

2. The method of claim 1, comprising an additional step of updating the configuration status of the associated component to correspond to the target configuration when the component configuration is updated.

3. The method of claim 2, comprising an additional step of waiting a time period associated with the associated component after the component configuration is updated before updating another component configuration.

4. The method of claim 1, wherein the configuration status is stored in a storage means and read from the storage means for the comparison with the target configuration.

5. The method of claim 4, wherein the storage means comprises one or more status registers in a memory.

6. The method of claim 1, wherein the apparatus is automatic test equipment performing a testing task.

7. The method of claim 1, wherein when the configuration status indicates the component configuration matches the target configuration, the component configuration is not updated.

8. The method of claim 1, comprising an additional step of waiting a time period associated with the associated component after the component configuration is updated before updating another component configuration.

9. The method of claim 1, wherein the component is one of a relay, a power supply, a signal generator, and a measuring unit associated with the apparatus.

10. An apparatus for performing testing related tasks, the apparatus comprising:
a processor for executing a configuration instruction according to a test program;
at least one configurable component that is configurable according to the configuration instruction; and
a configuration interface for analyzing the configuration instruction to determine an identity of an associated component and a target configuration for the associated component, for comparing the target configuration with a configuration status of the associated component, and for updating a component configuration of the component to the target configuration only when the configuration status indicates the component configuration is different from the target configuration.

11. The apparatus of claim 10, further comprising a storage means for storing the configuration status, the storage means being accessed by the configuration interface to read the configuration status for the comparison with the target configuration.

12. The apparatus of claim 11, wherein the configuration interface updates the configuration status in the storage device for the associated component to correspond to the target configuration when the component configuration is updated.

13. The apparatus of claim 11, wherein the storage means comprises one or more status registers in a memory.

14. The apparatus of claim 10, wherein when the configuration status indicates the component configuration matches the target configuration, the component configuration is not updated.

15. The apparatus of claim 10, wherein the configuration interface waits a time period associated with the associated component after the component configuration is updated but before updating another component configuration.

16. The apparatus of claim 10, wherein the each of the at least one configurable components is one of a relay, a power supply, a signal generator, and a measuring unit associated with the apparatus.

17. The apparatus of claim 10, wherein the configuration interface comprises a program being executed by the processor.

18. The apparatus of claim 10, wherein the configuration interface comprises a program being executed by a second processor.

19. An apparatus for performing testing tasks, the apparatus comprising:
logic that analyzes a test program configuration instruction to determine an identity of an associated component and a target configuration for the associated component;
logic that compares the target configuration with a configuration status of the associated component; and
logic that updates a component configuration of the component to the target configuration only when the configuration status indicates the component configuration is different from the target configuration.

20. The apparatus of claim 19, comprising additional logic that updates the configuration status of the associated component to correspond to the target configuration when the component configuration is updated.

21. The apparatus of claim 20, comprising additional logic that waits a time period associated with the associated component after the component configuration is updated but before updating another component.

22. The apparatus of claim 20, wherein the component is one of a relay, a power supply, a signal generator, and a measuring unit associated with the apparatus.

23. The apparatus of claim 19, further comprising a storage means and wherein the configuration status is stored in the storage means and read from the storage means for the comparison with the target configuration.

24. The apparatus of claim 23, wherein the storage means comprises one or more status registers in a memory.

25. The apparatus of claim 19, comprising additional logic that does not update the component configuration when the configuration status indicates the component configuration matches the target configuration.

26. The apparatus of claim 19, comprising additional logic that waits a time period associated with the associated component after the component configuration is updated but before updating another component configuration.

27. An apparatus for interfacing a test program for an automatic test equipment apparatus to at least one configurable component, the apparatus comprising a configuration interface for analyzing a configuration instruction executed according to the test program to request that an associated component be configured to determine an identity of the associated component and a target configuration for the associated component, for comparing the target configuration with a configuration status of the associated component, and for updating a component configuration of the component to the target configuration only when the configuration status indicates the component configuration is different from the target configuration.

28. The apparatus of claim 27, further comprising a storage means for storing the configuration status, the storage means being accessed by the processor to read the configuration status for the comparison with the target configuration and update the configuration status according to the target configuration.

29. A method of configuring components in automatic test equipment, comprising the steps of:
storing the configuration status of configurable components in the automatic test equipment;
analyzing a program configuration instruction to determine an identity of a component to be configured and a target configuration for the identified component;
comparing the target configuration with the stored configuration status for the identified component; and
updating a configuration of the identified component to the target configuration when the stored configuration status indicates the component configuration is different from the target configuration.

30. The method of claim 29, comprising an additional step of updating the stored configuration status of the identified component to correspond to the target configuration when the component configuration is updated.

31. Automatic test equipment comprising:
- at least one component that is configurable according to configuration instructions;
- a processor for executing a configuration instruction according to a test program;
- a memory storing the configuration status of said component; and
- a configuration interface for analyzing the configuration instruction to determine a target configuration for said component, comparing the target configuration with the configuration status stored in said memory, and updating the configuration of said component to the target configuration when the configuration status indicates the configuration of said component is different from the target configuration.

32. An apparatus for interfacing a test program for automatic test equipment to at least one configurable component, the apparatus comprising a configuration interface for analyzing a configuration instruction executed according to the test program to determine a target configuration for said component, comparing the target configuration with a stored configuration status of said component, and updating a configuration of said component to the target configuration when the configuration status indicates the component configuration is different from the target configuration.

* * * * *